US 6,650,569 B2

(12) United States Patent
Angelica et al.

(10) Patent No.: US 6,650,569 B2
(45) Date of Patent: Nov. 18, 2003

(54) BOOST DEVICE FOR NONVOLATILE MEMORIES WITH AN INTEGRATED STAND-BY CHARGE PUMP

(75) Inventors: Martino Angelica, Palermo (IT); Antonino Mondello, Messina (IT)

(73) Assignee: STMicroelectronics S.r.l, Agrate Brianza (IT)

( * ) Notice: Subject to any disclaimer, the term of this patent is extended or adjusted under 35 U.S.C. 154(b) by 0 days.

(21) Appl. No.: 10/076,134

(22) Filed: Feb. 13, 2002

(65) Prior Publication Data

US 2002/0167841 A1 Nov. 14, 2002

(30) Foreign Application Priority Data

Feb. 16, 2001 (IT) .................................. TO2001A0143

(51) Int. Cl.[7] .............................................. G11C 16/04
(52) U.S. Cl. .............. 365/185.18; 365/233; 365/189.11
(58) Field of Search ........................... 365/185.18, 233, 365/194, 189.09, 189.11; 327/536, 156

(56) References Cited

U.S. PATENT DOCUMENTS 5,986,928 A * 11/1999 Engh et al. ............ 365/185.03
6,369,642 B1 * 4/2002 Zeng .......................... 327/536

* cited by examiner

*Primary Examiner*—David Lam
(74) *Attorney, Agent, or Firm*—Lisa K. Jorgenson; Robert Iannucci; Seed IP Law Group PLLC (57) ABSTRACT

The boost device comprises a charge pump circuit having an input and a main output between which an input stage, an intermediate stage and a main output stage are cascade connected. The charge pump circuit also comprises a stand-by output stage having an input node connected to an output node of said intermediate stage and an output node connected to a stand-by output of the charge pump circuit. The boost device further comprises a phase generator stage having a signal input receiving a suitable clock signal generated by a clock generator stage and output terminals generating phase signals supplied to phase inputs of the charge pump circuit.

23 Claims, 6 Drawing Sheets

BOOST DEVICE FOR NONVOLATILE MEMORIES WITH AN INTEGRATED STAND-BY CHARGE PUMP

BACKGROUND OF THE INVENTION

1. Field of the Invention

The present invention relates to a boost device for nonvolatile memories with and integrated stand-by charge pump.

2. Description of the Related Art

As is known, when a memory device is not used, most of its internal circuits are switched off so as to reduce consumption (waiting or stand-by phase). However it is necessary to keep some circuits operating to allow a faster return of the memory device from stand-by to the main operating condition (user-mode). In particular, during stand-by, the stand-by charge pump, which feeds the memory cell of the device with a voltage close to the reading voltage, is kept on.

Figure 1:
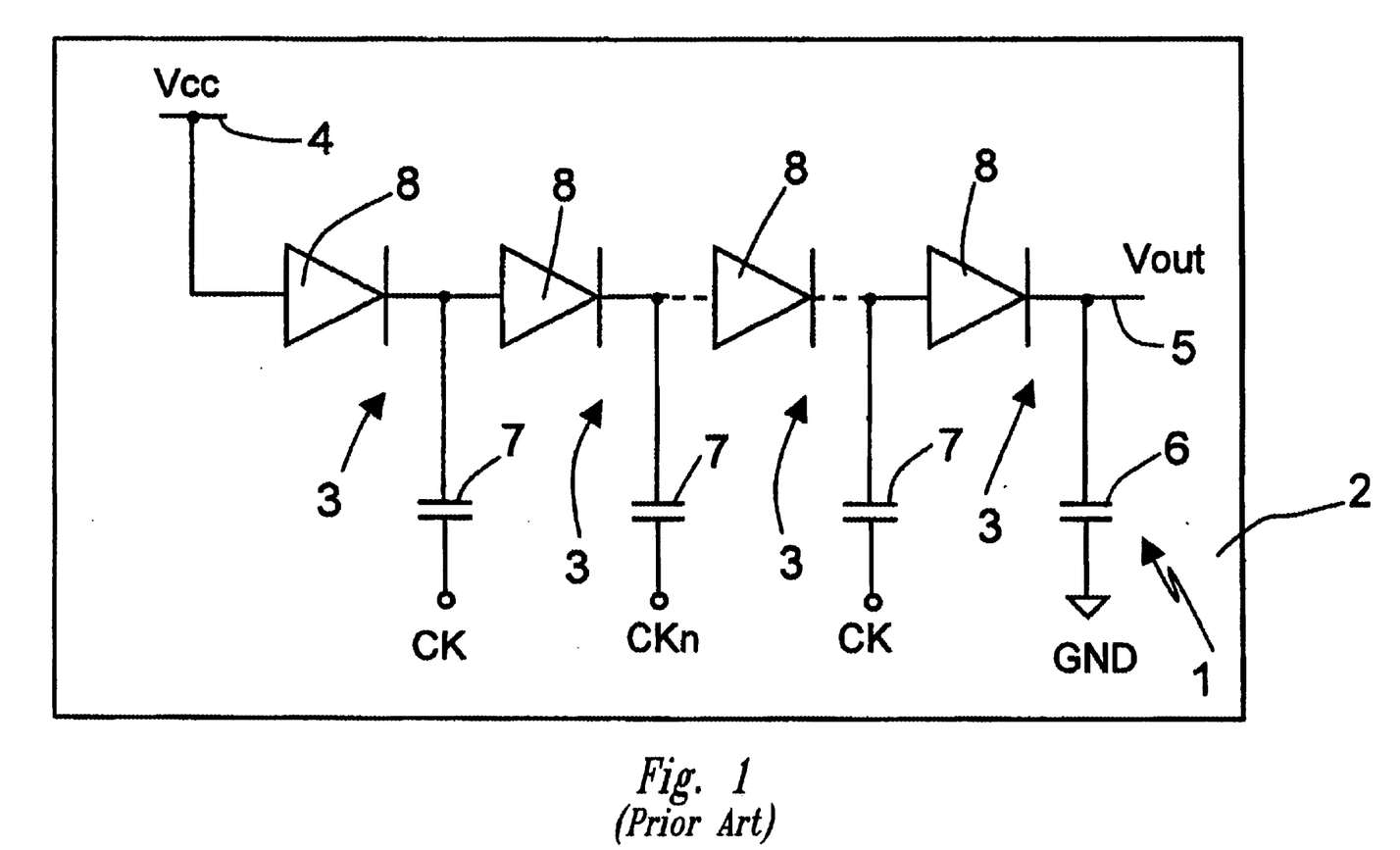
FIG. 1 shows a circuit diagram of a boost device according to the prior art.

On this matter, FIG. 1 shows a stand-by charge pump 1, of the diode type with two opposed phases, included in a memory device 2.

In greater detail, the stand-by charge pump 1 comprises a plurality of stages 3 connected in series between a supply line 4, set at a supply voltage $V_{cc}$, and an output terminal 5 connected to an output capacitor 6, on which an output voltage $V_{out}$ is present. Each stage 3 comprises a boost capacitor 7 and a switch 8, implemented by a diode, which is switched on or off alternately with the adjacent one. The charge transfer from one stage to the other takes place under the control of phase signals CK and CKn which are complementary to each other. The value of the output voltage $V_{out}$ is given by the equation:

$$V_{out} = (N+1)*(V_{cc} - V_{th})$$

where $V_{th}$ is the threshold voltage of each diode and N is the number of stages 3 of the stand-by charge pump 1.

As previously stated, the stand-by charge pump comes into operation only when the memory device is in stand-by. Consequently, during stand-by there is a considerable consumption of energy since the stand-by charge pump needs a certain time to supply the memory device with a voltage close to the reading voltage.

Moreover, the problem of area occupation is serious because the stand-by charge pump is distinct from the main charge pump, which is used during programming and reading of the memory device, and each charge pump occupies a not negligible area, since it comprises high capacities.

BRIEF SUMMARY OF THE INVENTION

An embodiment of the present invention is to overcome the limitations and drawbacks indicated above with reference to the prior art.

According to the present invention a boost device for nonvolatile memories with an integrated stand-by charge pump is provided by a boost device for nonvolatile memories, comprising a charge pump circuit having an input and a first output, the charge pump circuit comprising at least one input stage and a first output stage cascade-connected between the input and the first output of the charge pump circuit, characterized in that the charge pump circuit comprises a second output stage connectable in parallel to the first output stage.

BRIEF DESCRIPTION OF THE SEVERAL VIEWS OF THE DRAWINGS

For a better understanding of the invention, an embodiment is now described, purely as a non-limitative example, with reference to the enclosed drawings, wherein.

DETAILED DESCRIPTION OF THE INVENTION

Figure 2:
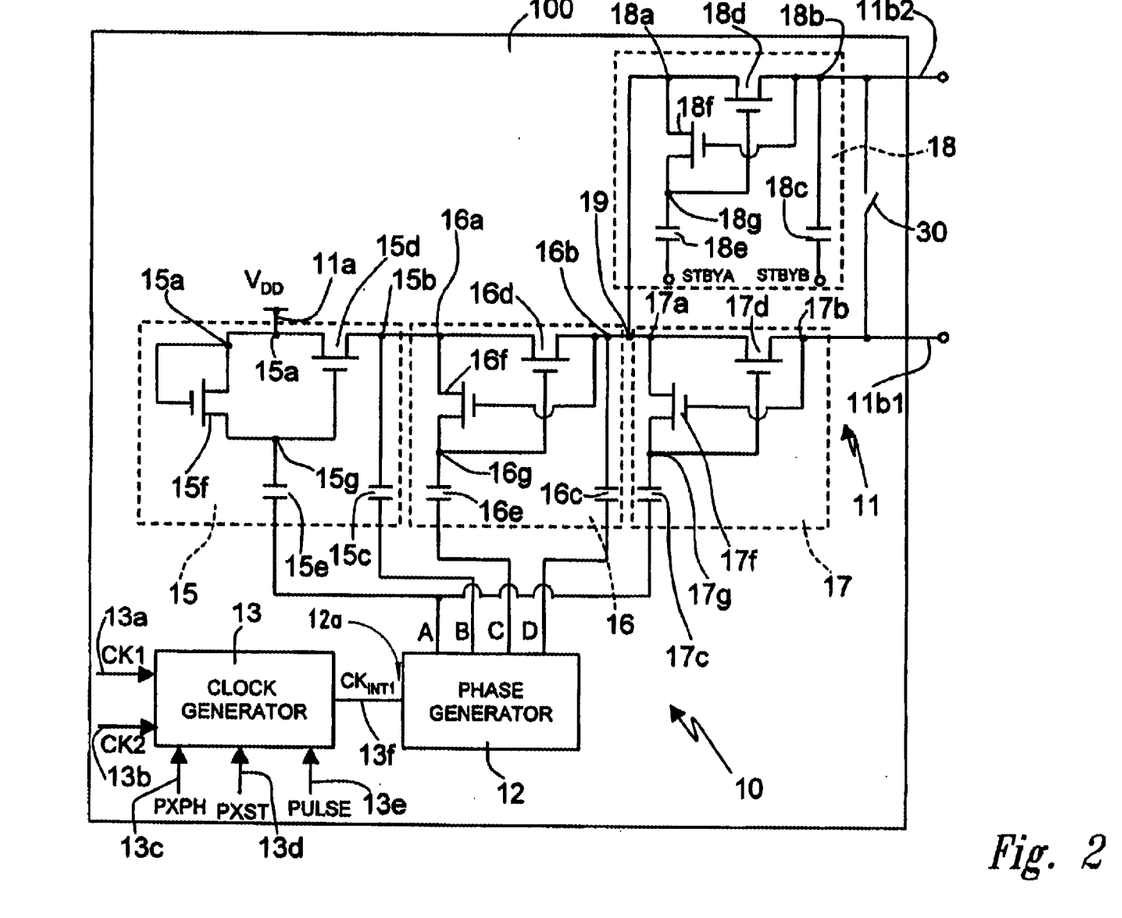
FIG. 2 shows a circuit diagram of a boost device according to the invention.

FIG. 2 shows a boost device 10 incorporated in a memory 100, of flash type, and comprises a four-phase type, charge pump circuit 11, a phase generator stage 12 and a clock generator stage 13.

In detail, the charge pump circuit 11 has an input 11a, receiving a supply voltage $V_{DD}$, a main output 11b1 and a stand-by output 11b2. The charge pump circuit 11 comprises an input stage 15, an intermediate stage 16 and a main output stage 17, cascade-connected to one another. The charge pump circuit 11 further comprises a stand-by output stage 18 connected in parallel to the main output stage 17.

The input stage 15, the intermediate stage 16, the main output stage 17 and the stand-by output stage 18 each have an input node 15a–18a and an output node 15b–18b. In greater detail, the input node 15a of the input stage 15 is connected to the input terminal 11a of the charge pump circuit 11 while the output node 17b of the main output stage 17 and the output node 18b of the stand-by output stage 18 are connected respectively to the main output 11b1 and to the stand-by output 11b2 of the charge pump circuit 11. Furthermore, the output node 16b of the intermediate stage 16 is connected to the input nodes 17a, 18a of the main output stage 17 and of the stand-by output stage through a circuit node 19.

The input stage 15 comprises a charge storage capacitor 15c; a charge transfer transistor 15d; a boost capacitor 15e; a precharge transistor 15f.

Specifically, the charge storage capacitor 15c has a first terminal connected to the output node 15b of the input stage 15 and a second terminal receiving a phase signal B supplied by the phase generator stage 12. The charge transfer transistor 15d is connected between the input node 15a and the output node 15b of the input stage 15 and has a gate terminal connected to a precharge node 15g. The boost capacitor 15e has a first terminal connected to the precharge node 15g and a second terminal receiving a phase signal A supplied by the phase generator stage 12. The precharge transistor 15f is diode-connected and is connected between the input node 15a of the input stage 15 and the precharge node 15g.

The intermediate stage 16 comprises a charge storage capacitor 16c; a charge transfer transistor 16d; a boost capacitor 16e; a precharge transistor 16f; a precharge node 16g.

The intermediate stage 16, as indicated, is structurally identical to the input stage 15 and differs from the latter only in that the charge storage capacitor 16c receives a phase signal D, the boost capacitor 16e receives a phase signal C and the precharge transistor 16f has a gate terminal connected to the output node 16b.

In turn the main output stage 17 comprises a charge transfer transistor 17d; a boost capacitor 17c; a precharge transistor 17f; a precharge node 17g.

The main output stage 17, as indicated, is structurally identical to the input stage 15 and differs from the latter only in that the precharge transistor 17f has a gate terminal connected to the main output 11b1 of the charge pump circuit 11 and the charge storage capacitor is not present.

The stand-by output stage 18 comprises a charge storage capacitor 18c; a charge transfer transistor 18d; a boost capacitor 18e; a precharge transistor 18f; a precharge node 18g.

The stand-by output stage 18, as indicated, is structurally identical to the input stage 15 and differs from the latter only in that the precharge transistor 18f has a gate terminal connected to the stand-by output 11b2 of the charge pump circuit 11, and the boost capacitor 18e and the charge storage capacitor 18c receive respectively a phase signal STBYA and a phase signal STBYB. In detail, the phase signals STBYA and STBYB are equal to the phase signals A and B during the reading and stand-by conditions of the memory 100 and differ from these during programming, as better described below.

Figure 3:
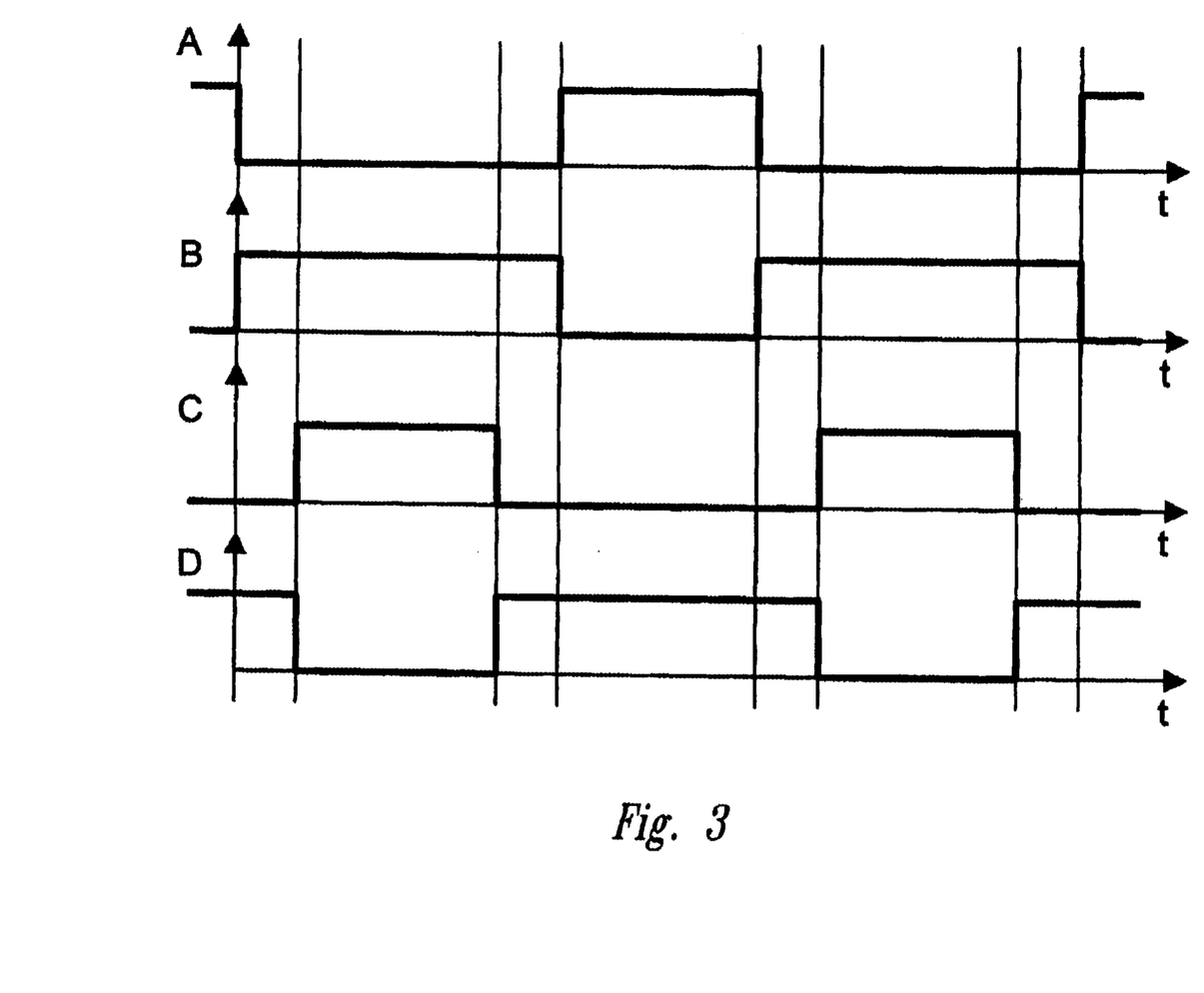
FIG. 3 shows the plot of electrical quantities measured in the boost device of FIG. 2.

In turn, the phase generator stage 12 is a logic circuit of a generally known type, having a first input 12a receiving a clock signal Ckint1, generated by the clock generator stage 13, and four outputs supplying the phase signals A, B, C, D. The phase signals A, B, C, D are logic signals switching between $V_{DD}$ and 1V, as shown in FIG. 3, with two different frequency values depending on the value assumed by the clock signal Ckint1 as described below.

The clock generator stage 13 has a first signal input 13a receiving a first timing signal CK1, having a first frequency value; a second signal input 13b receiving a second timing signal CK2, having a second frequency value, lower than the first value; a third input signal 13c receiving a first pump enable signal PXPH which enables the charge pump circuit 11 during the main operation condition (reading or programming) of the memory 100; a fourth signal input 13d receiving a stand-by signal PXST; a fifth signal input 13e receiving a second pump enable signal PULSE which enables the charge pump circuit 11 during stand-by operation of the memory 100; an output 13f supplying the clock signal Ckint1.

Figure 4:
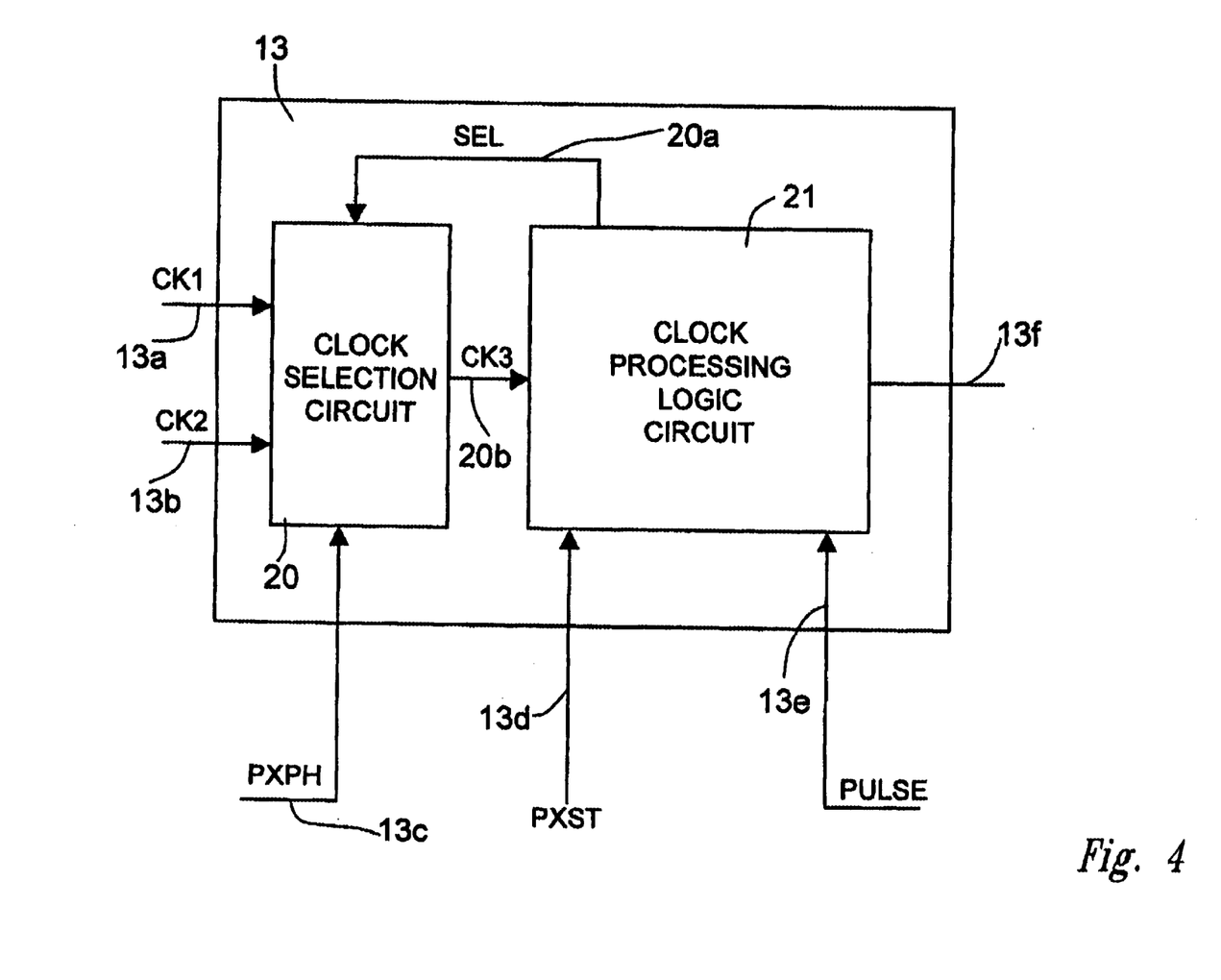
FIG. 4 shows a circuit diagram of a detail of the boost device of FIG. 2.

As shown in FIG. 4, the clock generator stage 13 comprises a clock selection circuit 20 and a clock processing logic circuit 21.

In greater detail, the clock selection circuit 20 has a first and a second signal input connected respectively to the first and the second signal input 13a, 13b of the clock generator stage 13, a selection input 20a receiving a frequency selection signal SEL generated by the clock processing logic circuit 21 and an output terminal 20b generating an output signal CK3 that is equal to the first or the second timing signal CK1, CK2 depending on the logic value of the frequency selection signal SEL.

In turn, the clock processing logic circuit 21 has a first input terminal connected to the output terminal 20b of the selection circuit 20, a second, a third and a fourth input terminal connected respectively to the third, fourth and fifth signal input 13c, 13d, 13e of the clock generator stage 13, a first output terminal connected to the selection input 20a of the clock selection circuit 20 and a second output terminal connected to the output 13f of the clock generator stage 13.

Figure 5:
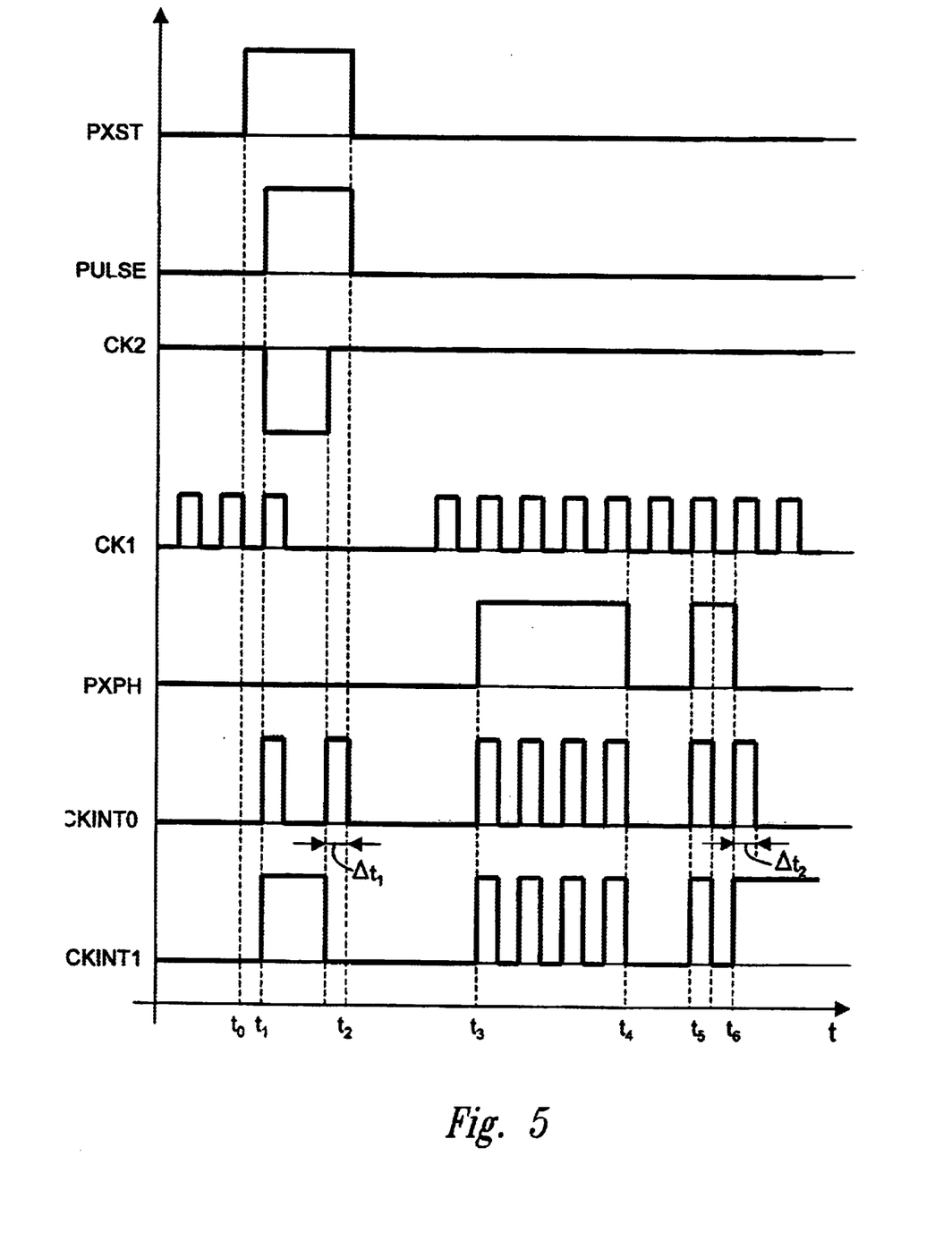
FIG. 5 shows the plot of further electrical quantities measured in the boost device of FIG. 2.

With reference to FIGS. 3 and 5, the operation of the boost device will now be described.

When the stand-by signal PXST is low, the memory 100 is in the main operating condition.

In this condition, if the first pump enable signal PXPH is high, the charge pump circuit 11 is enabled and the clock signal Ckint1 is equal to the first timing signal CK1.

If only one voltage value is required during the main operating condition (reading of the memory 100), the two outputs 11b1 and 11b2 of the charge pump 11 are short-connected (for example by closing a switch 30) and the main output stage 17 is in parallel with the stand-by output stage 18. In these conditions, the charge pump circuit 11, receiving the main timing signal CK1, acts as a normal four-step charge pump determining the sequence of the charging and charge transfer steps in a known way (for example as described in U.S. Pat. No. 6,075,402 in the name of the same applicant) and depending on the value of the phase signals A, B, C, D (the phase signals STBYA and STBYB having the same behavior respectively as the phase signals A and B).

Advantageously, the connection between the main output stage 17 and the stand-by stage 18 gives a greater driving capability of the memory cells connected to the charge pump circuit 11, thanks to the additional presence of the charge storage capacitor 18c of the stand-by output stage 18.

If instead, during the main operating condition, two different voltage values are required (programming of the memory 100), the stand-by output stage 18 and the main output stage 17 are separated (switch 30 off and outputs 11b1, 11b2 isolated) and are regulated by two different regulators. In this case, the phase signals STBYA and STBYB have different timing signals with respect to the phase signals A and B, though being generated from the same timing signal (that is the first timing signal CK1).

Vice versa, when the stand-by signal PXST is high, the memory 100 is in stand-by operating condition.

In this condition, if the second pump enable signal PULSE is also high, the charge pump circuit 11 is enabled and the clock signal Ckint1 is equal to the second timing signal CK2.

In this case too, the two outputs 11b1 and 11b2 of the charge pump 11 are connected (since the switch 30 is closed) and the main output stage 17 is in parallel with the stand-by output stage 18. In these conditions, the charge pump circuit 11, receiving the second timing signal CK2, acts as a normal stand-by charge pump driven by the phase signals A, B, C, D generated with a longer period (for example 1 μs) with respect to the main operating condition (wherein the phase signals have a period of, for example, 50 ns to 100 ns). In this case too, the phase signals STBYA and STBYB have the same plot as the phase signals A and B.

Advantageously, when stand-by operation is enabled, the first two stages 15 and 16 of the charge pump 11 are already precharged at an intermediate voltage $V_X$ (present on the circuit node 19) close to the required voltage.

In this way a considerable current saving is obtained and therefore lower consumption, since the charge pump 11 requires a shorter time to supply the memory 100 with the required voltage.

According to a further aspect of the present invention, the clock generator stage 13 having the structure described above makes it possible to avoid the occurrence of undesirable charge sharing phenomena generated by spurious impulses.

It is supposed indeed that during the transition from a main operating condition to a stand-by operating condition and vice versa, the first timing signal CK1 and the second timing signal CK2 are in phase opposition. By performing a simple multiplexing operation on the two timing signals CK1 and CK2, a resulting clock signal Ckint0 would be obtained with a logic state transition which would give rise to undesired "pumping actions" (FIG. 5, time intervals Δt1, Δt2).

Considering that the passage from main operating condition to stand-by operating condition can be forced by the user by regulating the memory enable signal CE and that the specifications of the memories allow "fast" transitions between the two above-mentioned operating conditions, even with periods of less than 100 ns, there would be a high number of undesired pumping actions per unit of time. This would cause an uncontrolled increase of the voltages in the last stages of the pumps, causing the exit from the SOA (Safe Operating Area) of the MOS transistors that compose them.

According to the second aspect of the present invention, this problem is overcome by making the clock generator stage 13 work with an operation described below with reference to FIGS. 4, 5 and 6.

Initially (FIG. 5, instant t0; FIG. 6, block 200) the stand-by signal PXST switches high (memory 100 in stand-by condition) and controls the clock processing logic circuit 21 so that it generates a first logic level for the frequency selection signal SEL (FIG. 6, block 201) such as to select the second timing signal CK2; consequently the output signal CK3 of the clock selection circuit 20 is the same as the second timing signal CK2.

Moreover, the first and the second pump enable signals PXPH, PULSE and the clock signal Ckint1 are low.

Subsequently, the second pump enable signal PULSE switches to high (instant t1, block 202 of FIG. 6). In these conditions, as soon as the clock processing logic circuit 21 detects the switching (here to low) of the second timing signal CK2 (block 203, FIG. 6), it controls the switching of the clock signal Ckint1 (block 204, FIG. 6). In the example in FIG. 5, the clock signal Ckint1 switches to high.

Figure 6:
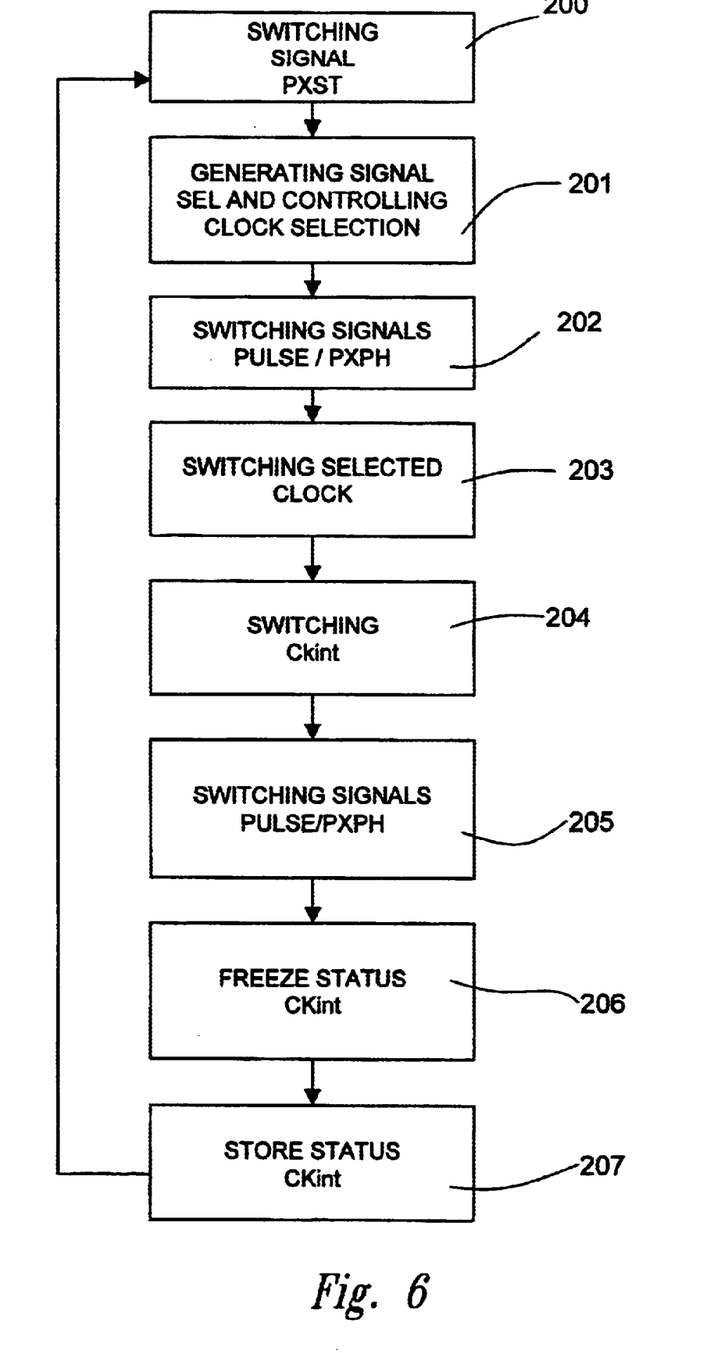
FIG. 6 presents a flow-chart of the operation of the detail of FIG. 4.

The clock signal Ckint1 then follows the transitions of the second timing signal CK2 until the second pump enable signal PULSE switches to low (instant t2, block 205 of FIG. 6); then the clock processing circuit 21 "freezes" the present status of the clock signal Ckint1 (block 206 of FIG. 6). In the example in FIG. 5, the clock signal Ckint1 is maintained low. Then, the present status of the clock signal Ckint1 is stored in a status register (not shown in FIG. 4) inside the circuit (FIG. 6, block 207). Thereby, spurious transitions (and therefore undesired pumping actions), affecting the known clock signal Ckint0 in the interval Δt1, are avoided.

In the instant t2, also the stand-by signal PXST switches to low (memory 100 in the main operating condition, block 200 in FIG. 6), so that the clock processing circuit 21 generates a second logic level for the frequency selection signal SEL so as to select the first timing signal CK1; consequently the output signal CK3 of the clock selection circuit 20 is equal to the first timing signal CK1 (FIG. 6, block 201).

Subsequently (instant t3), the first pump enable signal PXPH switches over (here to high, FIG. 6, block 202). Since the clock processing circuit 21 also detects the switching of the first timing signal CK1, here to high (block 203 in FIG. 6), it controls the switching of the clock signal Ckint1 (block 204 in FIG. 6). In the example in FIG. 5, the clock signal Ckint1 switches to high.

The clock signal Ckint1 then follows the transitions of the first timing signal CK1 until the first pump enable signal PXPH switches to low (instant t4, block 205); then the clock processing circuit 21 maintains the present (low) status of the clock signal Ckint1 (FIG. 6, block 206) and stores it in the status register (FIG. 6, block 207).

Subsequently (instant t5), the first pump enable signal PXPH switches over again to high level and the clock processing circuit 21, detecting also the switching of the first timing signal CK1 (here to high), controls switching of the clock signal Ckint1 (FIG. 6, block 204). In FIG. 5, the clock signal Ckint1 switches to high.

The clock signal Ckint1 then follows the transitions of the first timing signal CK1 until the first pump enable signal PXPH switches to low (instant t6, block 205 of FIG. 6), controlling the clock processing circuit 21 so as to "freeze" the present (high) status of the clock signal Ckint1 (block 206 in FIG. 6) and to store it in the status register (FIG. 6, block 207). Thereby, the spurious transition affecting the known clock signal Ckint0 in the interval Δt2 is avoided.

Thereby, a clock signal Ckint1 was obtained free of spurious transitions in the passage from stand-by operation to main operating condition and vice versa.

The advantages of the described boost device 10 are clear from the above. A further advantage is that the boost device 10 occupies a small area, so that the structure of the stand-by charge pump does not have to be made separate from the structure of the main charge pump, and only one phase generator is required for both charge pumps.

Lastly it is clear that modifications and variations may be made to the described boost device, without leaving the scope of the present invention.

We claim:

1. A boost device for nonvolatile memories, comprising a charge pump circuit having an input and first output, said charge pump circuit comprising at least one input stage and a first output stage cascade-connected between said input and said first output of said charge pump circuit, wherein said charge pump circuit comprises a second output stage coupled in parallel to said first output stage.

2. A boost device according to claim 1 wherein said second output stage has an input node connected to an input node of said first output stage and output node connected to a second output of said charge pump circuit.

3. A boost device according to claim 2 wherein said first and second output of said charge pump circuit are connected to each other by a switch, said switch being on during a reading and a stand-by condition and off during a programming condition.

4. A boost device according to claim 3 wherein said charge pump circuit comprises an intermediate stage connected between an output node of said input stage and said input node of said first output stage.

5. A boost device according to claim 4 wherein said input stage, said intermediate stage and said fi t and second output stage each comprise:
   a first transistor having a first and a second conduction terminal and a control terminal, said first and second conduction terminal being connected respectively to an input node and to an output node of said input stage, intermediate stage and first and second output stage;
   a boost capacitor having a first terminal connected to a phase input of said charge pump circuit and a second terminal connected to said control terminal of said first transistor; and
   a second transistor connected between said input node and a second terminal of said boost capacitor.

6. A boost device according to claim 5 wherein said input stage, said intermediate stage and said second output stage further comprises a storage capacitor having a first and a second terminal, said first terminal of said storage capacitor being connected to a further phase input of said charge pump circuit and said second terminal of said storage capacitor being connected to said output node.

7. A boost device according to claim 6 further comprising a phase generator stage having a signal input receiving a clock signal and output terminals generating phase signals supplied to said phase inputs of said charge pump circuit.

8. A boost device according to claim 7 further comprising a clock generator stage having a first signal input receiving a first timing signal having a first frequency value, a second signal input receiving a second timing signal having a second frequency value, a third signal input receiving a first enable signal; a fourth signal input receiving an operative condition signal; a fifth signal input receiving a second enable signal; an output supplying said clock signal.

9. A boost device according to claim 8 wherein said first frequency value is higher than said second frequency value.

10. A boost device according to claim 9 wherein said clock generator stage comprises:
   a clock selection circuit having a first and a second signal input connected respectively to said first and second signal input of said clock generator stage, a selection input receiving a frequency selection signal and an output terminal; and
   a clock processing logic circuit having a first input terminal connected to said output terminal of said clock selection circuit, a second, a third and a fourth input terminal connected respectively to said third, fourth and fifth signal input of said clock generator stage, a first output terminal connected to said selection input of said clock selection circuit, a second output terminal connected to said output of said clock generator stage.

11. A boost device according to claim 10 wherein said clock processing logic circuit comprises:
   a first detection means detecting a first change of logic status of said operative condition signal;
   a signal generating means generating said frequency selection signal at a first logic status and controlling the selection of one of said first and second timing signals;
   a second detection means detecting a first change of logic status of one of said first and second enable signals;
   a third detection means detecting a change of logic status of said selected timing signal;
   a control means controlling a change of logic status of said clock signal;
   a fourth detection means detecting a second change of logic status of one of said first and second enable signals;
   a blocking means freezing a logic status of said clock signal; and
   a storage means storing said logic status of said clock signal.

12. A clock generating stage comprising:
   a first acquisition means acquiring a first timing signal having a first frequency;
   a second acquisition means acquiring a second timing signal having a second frequency, different from said first frequency;
   a clock selection means having a first and a second signal input receiving respectively said first and said second timing signal and an output supplying an output signal having selectively said first or said second frequency; and
   a logic means connected to said output of said clock selection means and generating a transition phase between said first and said second frequency without spurious switching.

13. A generating stage according to claim 12 wherein said logic means comprise:
   a first detection means detecting a first logic status change of an operative condition signal received at a first signal input of said logic means;
   a signal generating means generating a frequency selection signal at a first logic level and controlling said clock selection means to select one of said first and second timing signals;
   a second detection means detecting a first logic status change of one of a first and a second enable signal received respectively at a second and at a third signal input of said logic means;
   a third detection means detecting a logic status change of said selected timing signal;
   a control means controlling a logic status change of said clock signal;
   a fourth detection means detecting a second logic status change of one of said first and second enable signals;
   a blocking means freezing a logic status of said clock signal; and
   a storage means storing said logic status of said clock signal.

14. A boost device for nonvolatile memories comprising:
   a charge pump circuit having an input, a plurality of phase signal inputs, a first output of a first output stage and a second output of a second output stage wherein the first and second output stages are coupled in parallel;
   a phase generator circuit having a clock input and a plurality of phase signal outputs wherein the plurality of phase signal outputs are coupled to the plurality of phase signal inputs of the charge pump circuit;
   a clock generator circuit having a first clock timing signal input, a second clock timing input signal, a first pump enable signal input, a stand-by signal input, a second pump enable signal input, and a clock output wherein the clock output is coupled to the clock input of the phase generator; and
   a switch having first and second terminals wherein the first terminal is coupled to the first output, and the second terminal is coupled to the second output.

15. The boost device according to claim 14 wherein a first voltage is supplied while the switch is closed, and alternatively, a second voltage is supplied while the switch is open.

16. A method for controlling pumping action in a boost device having a charge pump, a first and second clock input signals, and a clock output signal, comprising the steps of:
   detecting a status change in a stand-by signal condition;
   generating a clock select signal to control the selection of the first or second clock input signals thereby coupling a selected clock signal to either the first or second clock input signal;
   detecting a first status change in a first and second enables signals;
   detecting a clock event in the selected clock signal;
   setting the clock output signal to the selected clock signal, upon the clock event of the selected clock signal;
   detecting a second status change in the first and second enable signals; and
   holding a present status of the clock output signal and storing the present status of the clock output signal, upon the second status change in the first and second enable signals.

17. A boost device, comprising:
   an input and a first output;
   a charge pump circuit including:
      a first output stage having an input node connected to the input and a first output node connected to the first output;

a second output stage having an input node coupled to the input node of the first output stage, and an output node; and a switch coupled between the output nodes of the first and second output stages to thereby couple the output stages in parallel with each other.

18. A boost device according to claim 17 wherein the charge pump circuit includes an input boosting stage connected between the input and the input nodes of the first and second output stages.

19. A boost device according to claim 18 wherein the input stage and the first and second output stages each comprise:

a first transistor connected between input and output nodes of the stage and having a control terminal;

a boost capacitor connected between a phase input and the control terminal of the first transistor; and a second transistor connected between the input node and the control terminal of the first transistor.

20. A boost device according to claim 17 wherein the charge pump circuit includes a plurality of phase inputs, the boost device further comprising a phase generator stage having a signal input receiving a clock signal and output terminals generating phase signals supplied to the phase inputs of the charge pump circuit.

21. A boost device according to claim 20, further comprising a clock generator stage having a first signal input receiving a first timing signal having a first frequency value, a second signal input receiving a second timing signal having a second frequency value different than the first frequency value, and an output supplying the clock signal based on the first and second timing signals.

22. A boost device according to claim 21 wherein the clock generator stage comprises:

a clock selection circuit having first and second signal inputs connected respectively to the first and second signal input of the clock generator stage, a selection input receiving a frequency selection signal, and an output node; and a clock processing logic circuit having a first input terminal connected to the output node of the clock selection circuit, a first output terminal connected to the selection input of the clock selection circuit, a second output terminal connected to the output of the clock generator stage, the clock processing stage being structured to provide to the selection input the frequency selection signal to control which of the first and second timing signal is used to produce the clock signal.

23. A boost device according to claim 21 wherein the clock generator stage detecting means for detecting a change in the clock signal and storage means for storing a logic status of the clock signal in response to detecting the change in the clock signal.

* * * * *

UNITED STATES PATENT AND TRADEMARK OFFICE
CERTIFICATE OF CORRECTION

PATENT NO.    : 6,650,569 B2
DATED         : November 18, 2003
INVENTOR(S)   : Martino Angelica et al.

It is certified that error appears in the above-identified patent and that said Letters Patent is hereby corrected as shown below:

<u>Column 6,</u>
Line 46, "fi t and second" should read as -- first and second --.

Signed and Sealed this

Sixteenth Day of March, 2004

JON W. DUDAS
*Acting Director of the United States Patent and Trademark Office*